United States Patent
Pichler

(10) Patent No.: US 6,881,598 B2
(45) Date of Patent: Apr. 19, 2005

(54) ORGANIC LIGHT-EMITTING DEVICE AND METHOD OF FABRICATING THE SAME

(75) Inventor: Karl Pichler, Hopewell Junction, NY (US)

(73) Assignee: Cambridge Display Technology Ltd., Cambridge (GB)

(*) Notice: Subject to any disclaimer, the term of this patent is extended or adjusted under 35 U.S.C. 154(b) by 0 days.

(21) Appl. No.: 10/350,129

(22) Filed: Jan. 24, 2003

(65) Prior Publication Data

US 2003/0151356 A1 Aug. 14, 2003

Related U.S. Application Data

(63) Continuation of application No. 09/180,037, filed as application No. PCT/GB97/01208 on May 2, 1997, now Pat. No. 6,541,790.

(30) Foreign Application Priority Data

May 3, 1996 (GB) .............................................. 9609282

(51) Int. Cl.$^7$ .......................... H01L 35/24; H01L 21/00
(52) U.S. Cl. ............................ 438/22; 438/653; 257/40
(58) Field of Search ........................... 257/40, 79, 103, 257/643; 438/22, 60, 653

(56) References Cited

U.S. PATENT DOCUMENTS

| | | | |
|---|---|---|---|
| 4,539,507 A | 9/1985 | VanSlyke et al. ............ 313/504 |
| 4,670,355 A | 6/1987 | Matsudaira .................. 428/690 |
| 4,720,432 A | 1/1988 | VanSlyke et al. | |
| 5,047,687 A | 9/1991 | VanSlyke et al. | |
| 5,059,861 A | 10/1991 | Littman et al. | |
| 5,059,862 A | 10/1991 | VanSlyke ..................... 313/503 |
| 5,085,946 A | 2/1992 | Saito et al. .................. 428/690 |
| 5,247,190 A | 9/1993 | Friend et al. .................. 257/40 |
| 5,457,565 A | 10/1995 | Namiki ........................ 359/273 |
| 5,491,377 A | 2/1996 | Janusauskas ................. 313/506 |
| 5,616,427 A | 4/1997 | Tada | |
| 5,714,838 A * | 2/1998 | Haight et al. ................ 313/506 |
| 5,739,635 A | 4/1998 | Wakimoto .................... 313/504 |
| 5,776,622 A | 7/1998 | Hung et al. .................. 428/690 |
| 6,111,274 A | 8/2000 | Arai ............................ 257/96 |

FOREIGN PATENT DOCUMENTS

| | | | |
|---|---|---|---|
| EP | 0349265 A2 | 1/1990 | |
| EP | 0390551 A2 | 10/1990 | |
| EP | 0439627 A1 | 8/1991 | .......... H05B/33/22 |
| EP | 0443861 A2 | 8/1991 | .......... H05B/33/14 |
| EP | 0550063 A2 | 7/1993 | |
| EP | 0740489 A1 | 10/1996 | |
| EP | 0977286 | 2/2000 | .......... H01L/51/20 |
| GB | 2286081 A | 8/1995 | |
| JP | 4-212284 | 8/1992 | |
| JP | 93-3080 | 8/1993 | |
| JP | 7-166160 | 6/1995 | |
| WO | WO 97/08919 | 3/1997 | |

OTHER PUBLICATIONS

L.S. Hung et al., "Enhanced Electron Injection in Organic Electroluminescence Devices Using An Al/LiF Electrode," Appl. Phys. Lett. 70 (2), Jan. 13, 1997, pp. 152–154.

(Continued)

Primary Examiner—Matthew Smith
Assistant Examiner—Calvin Lee
(74) Attorney, Agent, or Firm—Therese A. Hendricks, Esq.

(57) ABSTRACT

An organic light-emitting device, comprising: a substrate; a first conductive layer formed over the substrate; at least one layer of a light-emissive organic material formed over the first conductive layer; a barrier layer formed over the at least one organic layer which acts to protect the at least one layer of organic material; and a second conductive layer, preferably a patterned sputtered layer, formed over the barrier layer.

35 Claims, 2 Drawing Sheets

OTHER PUBLICATIONS

G.E. Jabbour et al., "Highly Efficient And Bright Organic Electroluminescent Devices With An Aluminum Cathode," Appl. Phys. Lett. 71 (13), Sep. 29, 1997, pp. 1762–1764.

Young–Eun Kim et al., "Enhanced Quantum Efficiency In Polymer Electroluminescence Devices By Inserting A Tunneling Barrier Formed By Langmuir–Blodgett Films," Appl. Phys. Lett 69 (5), Jul. 29, 1996, pp. 599–601.

F. Li et al., "Fabrication And Electroluminescence of Double–Layered Organic Light–Emitting Diodes With The $Al_2O_3$/Al Cathode," Appl. Phys. Lett 70 (10), Mar. 10, 1997, pp. 1233–1235.

Helen Kim et al., "Silicon Compatible Organic Light Emitting Diode," Journal of Lightwave Technology, vol. 12, no. 12, Dec. 1994, pp. 2107–2113.

Jabbour et al., "Novel Techniques In Fabricating More Efficient And Brighter Organic Electroluminescent Devices," SPIE, vol. 3148, Optical Sciences Center, University of Arizona, Tucson, Arizona.

Gu et al., "Transparent Organic Light Emitting Devices," Appl. Phys. Lett., vol. 68, No. 19, 1996 American INstitute of Physics, May 6, 1996, pp. 2606–2608.

International Search Report for GB 9609282.0, Apr. 29, 1997.

Bulovic et al. "Transparent light–emitting devices," Nature 380, Mar. 7, 1996, p. 29.

Tang et al. "Organic electroluminescent diodes," Appl. Phys. Lett. 51(12), Sep. 21, 1987, pp. 913–915.

* cited by examiner

ORGANIC LIGHT-EMITTING DEVICE AND METHOD OF FABRICATING THE SAME

This is a continuation of application Ser. No. 09/180,037, filed May 6, 1999 and issued as U.S. Pat. No. 6,541,790, which claims priority from (1) PCT/GB97/01208 filed May 2, 1997, and (2) GB 9609282.0 filed May 3, 1996, each of which are incorporated herein by reference.

BACKGROUND OF THE INVENTION

The present invention relates to organic light-emitting devices, in particular patterned or pixelated organic light-emitting diodes, and a method of fabricating the same.

Organic light-emitting devices (OLED's) such as described in our earlier U.S. Pat. No. 5,247,190 or in Van Slyke et al.'s U.S. Pat. No. 4,539,507 have great potential for use as monochrome and multi-colour displays. OLED's based on semiconductive conjugated polymers are described in our earlier U.S. Pat. No. 5,247,190, the contents of which are incorporated herein by reference. Principally, an OLED consists of an anode which injects positive charge carriers, a cathode which injects negative charge carriers and at least one organic electroluminescent layer sandwiched between the two electrodes. Typically, the thickness of the at least one organic layer is of the order of 100 nm and the electrical conductivity of the material of the at least one organic layer is sufficiently low as to avoid current spread from the overlap area between the cathode and the anode. Thus, light emission from the at least one organic layer occurs only where the cathode and the anode overlap and therefore pixelation and patterning is achieved simply by patterning the electrodes. High resolution is readily achieved and is principally limited only by the overlap area of the cathode and the anode and thus by the size of the cathode and the anode. Dot-matrix displays are commonly fabricated by arranging the cathode and the anode as perpendicular arrays of rows and columns, with the at least one organic layer being disposed therebetween.

Low resolution dot-matrix displays can, for example, be fabricated by coating at least one organic electroluminescent layer onto a substrate having thereon an array of indium-tin oxide (ITO) lines which act as an anode. A cathode comprising an array of lines perpendicular to those of the anode is provided on the other side of the at least one organic layer. These cathode lines may, for example, be lines of aluminium or an aluminium-based alloy which can be evaporated or sputtered through a physical shadow mask. However, shadow masking may not be desirable for various reasons. In particular, there are significant constraints on the use of shadow masks when displays of large area and/or high resolution are required. In order to produce such electrode line arrays and other patterns of large area and/or high resolution one would normally have to use various forms of lithography.

In order to fabricate efficient and stable OLED's with the desired electrical and light output characteristics great care must normally be taken in the design and construction of the interfaces between any organic layer and the electrodes. The particular importance of these interfaces is due to the fact that charge carriers should be injected efficiently from the electrodes into the at least one organic layer.

Maintaining the desired electrical and light output characteristics of the pixels in an OLED display when lithographic processes are used to fabricate the electrode patterns, in particular where those patterns are on top of the at least one organic layer, is not trivial owing to the risk of the lithographic processes modifying and potentially damaging the organic layer/electrode interfaces and the vicinity. Such damage during lithography may originate from the photoresists, the developers, the etching processes (both dry and wet, negative and positive techniques and etch and lift-off) or the solvents used. It should be mentioned here that conjugated polymers are often deposited from and are soluble in organic or aqueous solvents.

Plasma etching/ashing is very often used in lithography to remove the photoresist or residual photoresist which may not have been washed off by the developer. Organic electroluminescent and charge transporting materials would normally be damaged, modified and/or etched very rapidly in such dry etching/ashing processes if directly exposed to the plasma.

It is an aim of the present invention to provide an efficient organic electroluminescent device that has a construction which allows for the use of various lithographic processes to form the electrode on top of at least one organic layer without significantly changing the electrical and light output characteristics of the display.

SUMMARY OF THE INVENTION

The present invention provides an organic light-emitting device, comprising: a substrate; a first conductive layer formed over the substrate; at least one layer of a light-emissive organic material formed over the first conductive layer; a barrier layer formed over the at least one organic layer which acts to protect the at least one layer of organic material; and a patterned second conductive layer formed over the barrier layer. In one embodiment the second conductive layer is sputter deposited. In another embodiment the second conductive layer is evaporated.

The present invention also provides an organic light-emitting device, comprising: a substrate; a first conductive layer formed over the substrate; at least one layer of a light-emissive organic material formed over the first conductive layer; a barrier layer formed over the at least one organic layer which acts to protect the at least one layer of organic material; and a sputtered second conductive layer formed over the barrier layer.

In one embodiment the first conductive layer is the anode and the second conductive layer is the cathode.

In another embodiment the first conductive layer is the cathode and the second conductive layer is the anode.

At least one of the two electrodes is at least semi-transparent. Preferably, the anode is light-transmissive. More preferably, the anode comprises indium-tin oxide, tin oxide or zinc oxide.

Preferably, the anode has a thickness in the range of from 50 to 200 nm.

Preferably, the cathode comprises Al or an alloy thereof.

Preferably, the first conductive layer is patterned.

Preferably, the at least one organic layer is patterned.

Preferably, the organic material is a conjugated polymer.

Preferably, the thickness of the at least one organic layer is about 100 nm.

Preferably, the barrier layer has a thickness in the range of from 1 to 10 nm. More preferably, the barrier layer has a thickness in the range of from 2 to 5 nm.

Preferably, the sheet resistance of the barrier layer is at least 1 MΩ/square.

Preferably, the barrier layer is a continuous layer.

Preferably, the barrier layer comprises a dielectric.

In one embodiment the dielectric comprises an inorganic oxide, preferably one of an oxide of Al, Ba, Ca, Mg, Ni, Si, Ti or Zr, an oxide of an Al alloy, or an oxide of Al—Li or Al—Mg. The oxide composition does not have to be stoichiometric. Preferably, the oxide is sub-stoichiometric.

In another embodiment the dielectric comprises a carbide, preferably a carbide of Hf, Mo, Nb, Ta, Ti, W or Zr.

In a further embodiment the dielectric comprises a boride, preferably a boride of Cr, Mo, Nb, Ti, W or Zr.

In a yet further embodiment the dielectric comprises a nitride, preferably a nitride of Ti or Zr.

In a yet still further embodiment the dielectric comprises a fluoride, preferably a fluoride of Ca or Mg.

Preferably, the substrate comprises a glass or a plastics material.

The present invention further provides a method of fabricating an organic light-emitting device, comprising the steps of: forming a first conductive layer over a substrate; forming at least one layer of a light-emissive organic material over the first conductive layer; forming a barrier layer over the at least one organic layer; and forming a patterned second conductive layer over the barrier layer; wherein the barrier layer acts to protect the at least one organic layer during subsequent processing steps. In one embodiment the second conductive layer is deposited by sputtering, preferably by DC magnetron or RF sputtering. In another embodiment the second conductive layer is deposited by evaporation, preferably by resistive or electron-beam thermal evaporation.

In one embodiment the step of forming the patterned second conductive layer comprises deposition through a shadow mask.

In another embodiment the step of forming the patterned second conductive layer comprises the steps of: forming a layer of a photoresist over the barrier layer; patterning the layer of photoresist to expose regions of the barrier layer where the second conductive layer is to be formed; depositing a conductive layer over the patterned layer of photoresist; and removing the regions of the conductive layer which overlie the patterned layer of photoresist.

Preferably, the method further comprises, prior to the step of depositing the conductive layer, a plasma cleaning step to remove any residual photoresist.

In a further embodiment the step of forming the patterned second conductive layer comprises the steps of: forming a layer of conductive material; forming a layer of a photoresist over the layer of conductive material; patterning the layer of photoresist to expose regions of the conductive layer; removing the exposed regions of the conductive layer; and removing the photoresist.

The present invention still further provides a method of fabricating an organic light-emitting device, comprising the steps of: forming a first conductive layer over a substrate; forming at least one layer of a light-emissive organic material over the first conductive layer; forming a barrier layer over the at least one organic layer; and forming a sputtered second conductive layer over the barrier layer; wherein the barrier layer acts to protect the at least one organic layer during subsequent processing steps. In an embodiment the second conductive layer is deposited by DC magnetron or RF sputtering.

In one embodiment the step of forming the patterned second conductive layer comprises deposition through a shadow mask.

In another embodiment the step of forming the patterned second conductive layer comprises the steps of: forming a layer of a photoresist over the barrier layer; patterning the layer of photoresist to expose regions of the barrier layer where the second conductive layer is to be formed; depositing a conductive layer over the patterned layer of photoresist; and removing the regions of the conductive layer which overlie the patterned layer of photoresist.

Preferably, the method further comprises, prior to the step of depositing the conductive layer, a plasma cleaning step to remove any residual photoresist.

In a further embodiment the step of forming the patterned second conductive layer comprises the steps of: forming a layer of conductive material; forming a layer of a photoresist over the layer of conductive material; patterning the layer of photoresist to expose regions of the conductive layer; removing the exposed regions of the conductive layer; and removing the photoresist.

The present invention also extends to the use of a barrier layer in an organic light-emitting device which includes at least one layer of an organic material arranged between first and second conductive layers which act as the electrodes for the device, wherein the barrier layer acts to protect the at least one organic layer against subsequent processing steps.

For the purpose of the invention it is important that the barrier layer has sufficient electrical resistance to prevent current spread in the device, particularly between pixels of the device. A thin layer of such a barrier layer, for example dielectrics such as metal oxides, arranged between the cathode and the adjacent organic layer has been found to improve the efficiency of OLED's as shown for example in JP-A-5-3080.

The provision of a continuous barrier layer establishes a well defined interface between the upper electrode and the organic layer. The interface between the upper electrode and the organic layer can be controlled by various processes, for example dry or wet cleaning, to which the barrier layer is much more resistant than the organic layer. In the case where inorganic materials such as the above-mentioned metal oxides are used as the barrier layer, the barrier layer acts as a very efficient etch-stop. Edge effects at the edges of pixels, which could occur when a patterned electrode is directly in contact with the adjacent organic layer, are also reduced if not eliminated with the introduction of a continuous barrier layer.

Such methods of fabricating organic light-emitting devices provide devices of improved performance and stability when the upper electrode deposited over the organic layer is a patterned layer. Preferably, the organic layer is deposited by way of evaporation (resistive or electron-beam) or sputtering (reactive or non-reactive). The preferred method, for example in the case where an inorganic metal oxide is used, is DC magnetron sputtering from a metal or alloy target in the presence of oxygen such that the stoichiometry can be readily controlled and the desired electrical properties can be achieved. RF sputtering from a dielectric target is also a possibility.

BRIEF DESCRIPTION OF THE DRAWINGS

A preferred embodiment of the present invention will now be described hereinbelow by way of example only with reference to the accompanying drawings, in which.

DETAILED DESCRIPTION OF A PREFERRED EMBODIMENT

Figure 1:
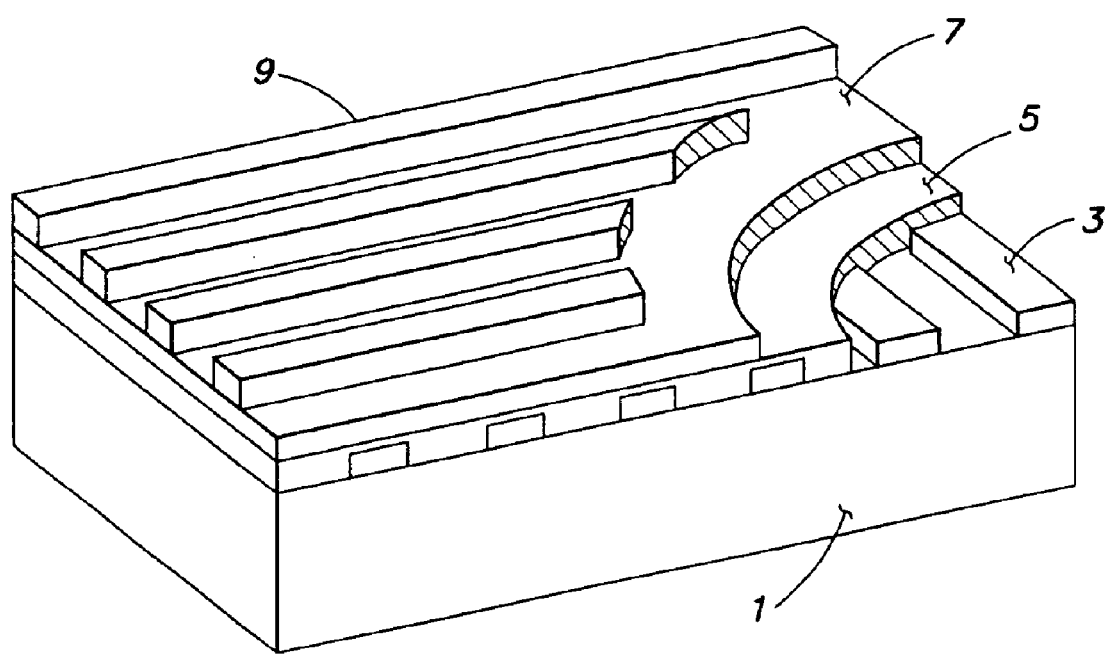
FIG. 1 illustrates an organic light-emitting device in accordance with a preferred embodiment of the present invention.

The organic light-emitting device comprises a substrate 1, an anode 3 formed over the substrate 1, a layer 5 of a light-emissive organic material formed over the anode 3, a barrier layer 7 formed over the organic layer 5, and a cathode 9 formed over the barrier layer 7.

The substrate 1 is a piece of glass, preferably having a thickness of less than 1.1 mm. The anode 3 is a patterned array of lines, preferably of indium-tin oxide having a thickness of from 50 to about 200 nm. The organic layer 5 is a layer of poly(p-phenylene vinylene) (PPV), an organic conjugated polymer as described in our earlier U.S. Pat. No. 5,247,190. The organic layer 5 preferably has a thickness of the order of 100 nm. The barrier layer 7 is a continuous layer of aluminium-lithium oxide of about 3.5 nm in thickness. The cathode 9 is a patterned array of lines.

The organic light-emitting device is fabricated in the following way. The substrate is coated with a thin layer of a conductive material, preferably indium-tin oxide of from about 50 to about 200 nm. The conductive material is patterned as an array of lines by way of standard wet-chemical etching. The etched structure is then, after cleaning, overcoated with a layer of poly(p-phenylene vinylene) having a thickness of about 100 nm. This structure is then overcoated with a continuous layer of aluminium-lithium oxide by DC magnetron sputtering from an aluminium-lithium target with a lithium content of from about 3 to about 5% in the aluminium to a thickness of typically 3.5 nm. Oxygen is mixed into the argon sputter gas in a ratio of about 4 (argon) to 1 (oxygen) in order to oxidise the aluminium-lithium while it is deposited on the substrate 1. It has been found that the exact stoichiometry of the oxide, although important for achieving efficient devices, is not crucial for the purpose of the present invention, namely to protect the organic layer from subsequent processing steps and act as an etch stop, as long as the sheet resistance of the barrier layer 7 is low enough to prevent intolerable current spread between neighbouring lines of the cathode 9. In this context intolerable here means that neighbouring pixels which are in the off state are not accidentally switched on due to the spread of current.

The patterned cathode 9 can be formed on the barrier layer 7 by various means, three examples of which are given below.

Firstly, the patterned cathode 9 can be formed by evaporation or sputtering through a shadow mask consisting of closely spaced fine lines which is placed in close proximity to the structure during deposition.

Secondly, standard lift-off photolithography can be employed to form the patterned cathode 9. Here, photoresist is coated the over the barrier layer 7 and then patterned/exposed and developed such that the photoresist is washed away where the cathode 9 is to be formed. A short argon-oxygen plasma clean can be used to clean off residual photoresist from the barrier layer 7. It has been found that neither this wet process nor the plasma clean damage the thin barrier layer 7 or the underlying organic layer 5. The material of the cathode 9 is then evaporated or sputtered over the etched area and the photoresist with the overcoated material is washed off (lifted-off).

Figure 2:
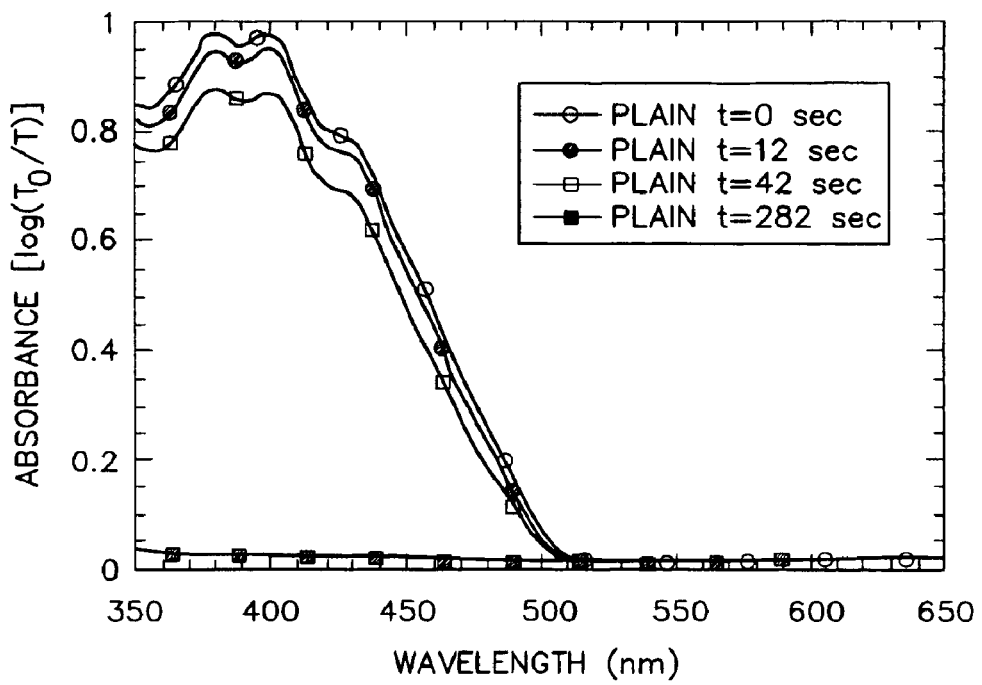
FIG. 2 illustrates the optical absorption characteristics of poly(p-phenylene vinylene) without a thin aluminium-lithium oxide coating layer as function of etch-time in an argon-oxygen plasma.
Figure 3:
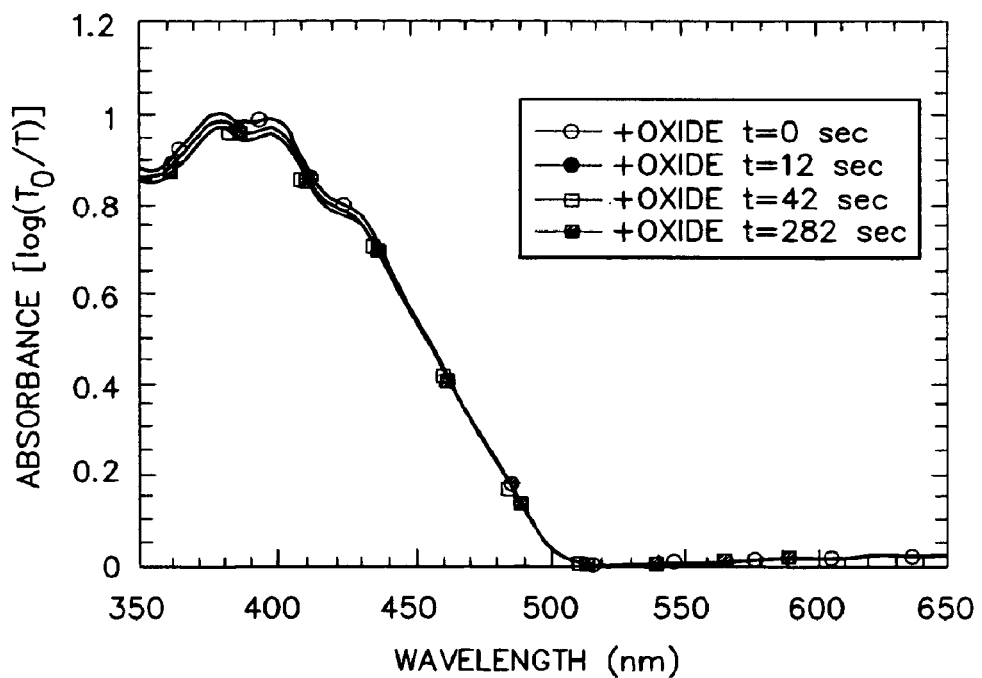
FIG. 3 illustrates the optical absorption characteristics of poly(p-phenylene vinylene) with a thin aluminium-lithium oxide coating layer as function of etch-time in an argon-oxygen plasma.

The etch-stop property of a thin aluminium-lithium oxide layer is shown in FIG. 3. The traces in FIG. 2 show the optical absorption characteristics of an uncoated film of poly(p-phenylene vinylene) on a glass substrate before (t=0 sec) and after various periods of exposure to an argon-oxygen dry plasma etch. The poly(p-phenylene vinylene) is etched away significantly, in particular after prolonged exposure to the plasma. The traces in FIG. 3 show an equivalent film of poly(p-phenylene vinylene) on a glass substrate but with an overlying layer of about 3.5 nm of aluminium-lithium oxide deposited thereon by reactive DC magnetron sputtering from an aluminium-lithium target. The traces show very clearly that the thin oxide layer is very efficient in protecting the poly(p-phenylene vinylene) layer from the plasma etch, i.e., the oxide layer acts as an etch-stop.

Thirdly, standard etch photolithography can be employed to form the patterned cathode 9. Here, the barrier layer 7 is coated with a continuous layer of the material for the cathode 9. Then, a photoresist is spun on top, patterned/exposed and developed. On the areas where there should be no cathode material the layer is etched away (dry or wet-chemical etching) and finally, after etching is complete, the residual photoresist is removed.

In all these cases, the continuous thin barrier layer acts as a protective layer and etch stop during the patterning process. It also acts as a buffer layer to reduce or eliminate possible edge effects at the edges of the pixels since these edges are not in direct contact with the organic layer. Without the barrier layer there would be a much greater risk of damaging the at least one organic layer and the interface with the top electrode where the top electrode is, for example, patterned to fabricate dot-matrix displays. Furthermore, the thin barrier layer also protects the organic layers to some degree against the ingress of, for example, oxygen and moisture, where no thick cathode layer is present.

It will be understood by a person skilled in the art that the present invention is not limited to the described embodiment but can be modified in many different ways within the scope of the invention as defined in the appended claims.

What is claimed is:

1. A method of fabricating an organic light-emitting device, comprising the steps of:
   forming a first conductive layer over a substrate;
   forming at least one layer of a light-emissive organic material over the first conductive layer;
   forming a barrier layer comprising a dielectric over the at least one organic layer; and
   forming a sputtered second conductive layer over the barrier layer.

2. A method of fabricating an organic light-emitting device according to claim 1, wherein the second conductive layer is patterned.

3. A method of fabricating an organic light-emitting device according to claim 2, wherein the step of forming the patterned second conductive layer comprises deposition through a shadow mask.

4. A method of fabricating an organic light-emitting device according to claim 2, wherein the step of forming the patterned second conductive layer comprises the steps of:
   forming a layer of a photoresist over the barrier layer;
   patterning the layer of photoresist to expose regions of the barrier layer where the second conductive layer is to be formed;

depositing a conductive layer over the patterned layer of photoresist; and removing the regions of the conductive layer which overlie the patterned layer of photoresist.

5. A method of fabricating an organic light-emitting device according to claim 4, further comprising, prior to the step of depositing the conductive layer, a plasma cleaning step to remove any residual photoresist.

6. A method of fabricating an organic light-emitting device according to claim 2, wherein the step of forming the patterned second conductive layer comprises the steps of:

forming a layer of conductive material;

forming a layer of a photoresist over the layer of conductive material;

patterning the layer of photoresist to expose regions of the conductive layer;

removing the exposed regions of the conductive layer; and removing the photoresist.

7. A method of fabricating an organic light-emitting device according to claim 2, wherein the second conductive layer is deposited by DC magnetron or RF sputtering.

8. A method according to claim 1, wherein the sheet resistance of the barrier layer is at least 1 MΩ/square.

9. A method according to claim 1, wherein the dielectric comprises an inorganic oxide.

10. A method according to claim 9, wherein the inorganic oxide is selected from the group consisting of an oxide of Al, Ba, Ca, Mg, Ni, Si, Ti or Zr, an oxide of an Al alloy, or an oxide of Al—Li or Al—Mg.

11. A method according to claim 9, wherein the oxide is sub-stoichiometric.

12. A method according to claim 1, wherein the dielectric comprises a carbide.

13. A method according to claim 12, wherein the carbide is selected from the group consisting of a carbide of Hf, Mo, Nb, Ta, Ti, W or Zr.

14. A method according to claim 1, wherein the dielectric comprises a boride.

15. A method according to claim 14, wherein the boride is selected from the group consisting of a boride of Cr, Mo, Nb, Ti, W or Zr.

16. A method according to claim 1, wherein the dielectric comprises a nitride.

17. A method according to claim 16, wherein the nitride is selected from the group consisting of a nitride of Ti or Zr.

18. A method according to claim 1, wherein the dielectric comprises a fluoride.

19. A method according to claim 18, wherein the fluoride is selected from the group consisting of a fluoride of Ca or Mg.

20. In a method of producing an organic light-emitting device including the steps of:

forming a first conductive layer over a substrate, forming at least one layer of organic material over the first conductive layer, and sputter-depositing a second conductive layer over the at least one layer of organic material, the improvement comprising:

forming an intermediate barrier layer comprising a dielectric between the second conductive layer and the at least one layer of organic material for protecting the at least one layer of organic material during the step of sputter-depositing the second conductive layer.

21. A method according to claim 20, wherein the intermediate layer is a fluoride layer.

22. A method according to claim 20, wherein the second conductive layer is patterned.

23. A method of fabricating an organic light-emitting device, comprising the steps of:

forming a first conductive layer over a substrate;

forming at least one layer of a light-emissive organic material over the first conductive layer;

forming a barrier layer over the at least one organic layer, wherein the sheet resistance of the barrier layer is at least 1 MΩ/square; and forming a sputtered second conductive layer over the barrier layer.

24. A method of fabricating an organic light-emitting device, comprising the steps of:

forming a first conductive layer over a substrate;

forming at least one layer of a light-emissive organic material over the first conductive layer;

forming a barrier layer comprising a dielectric over the at least one organic layer, wherein the dielectric comprises an inorganic oxide; and forming a sputtered second conductive layer over the barrier layer.

25. A method according to claim 24, wherein the inorganic oxide is selected from the group consisting of an oxide of Al, Ba, Ca, Mg, Ni, Si, Ti or Zr, an oxide of an Al alloy, or an oxide of Al—Li or Al—Mg.

26. A method according to claim 24, wherein the oxide is sub-stoichiometric.

27. A method of fabricating an organic light-emitting device, comprising the steps of:

forming a first conductive layer over a substrate;

forming at least one layer of a light-emissive organic material over the first conductive layer;

forming a barrier layer comprising a dielectric over the at least one organic layer, wherein the dielectric comprises a carbide; and forming a sputtered second conductive layer over the barrier layer.

28. A method according to claim 27, wherein the carbide is selected from the group consisting of a carbide of Hf, Mo, Nb, Ta, Ti, W or Zr.

29. A method of fabricating an organic light-emitting device, comprising the steps of:

forming a first conductive layer over a substrate;

forming at least one layer of a light-emissive organic material over the first conductive layer;

forming a barrier layer comprising a dielectric over the at least one organic layer, wherein the dielectric comprises a boride; and forming a sputtered second conductive layer over the barrier.

30. A method according to claim 29, wherein the boride is selected from the group consisting of a boride of Cr, Mo, Nb, Ti, W or Zr.

31. A method of fabricating an organic light-emitting device, comprising the steps of:

forming a first conductive layer over a substrate;

forming at least one layer of a light-emissive organic material over the first conductive layer;

forming a barrier layer comprising a dielectric over the at least one organic layer, wherein the dielectric comprises a nitride; and forming a sputtered second conductive layer over the barrier layer.

32. A method according to claim 31, wherein the nitride is selected from the group consisting of a nitride of Ti or Zr.

33. A method of fabricating an organic light-emitting device, comprising the steps of:

forming a first conductive layer over a substrate;

forming at least one layer of a light-emissive organic material over the first conductive layer;

forming a barrier layer comprising a dielectric over the at least one organic layer, wherein the dielectric comprises a fluoride; and forming a sputtered second conductive layer over the barrier layer.

34. A method according to claim 33, wherein the fluoride is selected from the group consisting of a fluoride of Ca or Mg.

35. In a method of producing an organic light-emitting device including the steps of:

forming a first conductive layer over a substrate, forming at least one layer of organic material over the first conductive layer, and sputter-depositing a second conductive layer over the at least one layer of organic material, the improvement comprising:

forming an intermediate barrier layer between the second conductive layer and the at least one layer of organic material for protecting the at least one layer of organic material during the step of sputter-depositing the second conductive layer, wherein the intermediate layer is a fluoride layer.

* * * * *